(12) United States Patent
Verilhac et al.

(10) Patent No.: US 9,735,361 B2
(45) Date of Patent: Aug. 15, 2017

(54) METHOD OF MAKING A STACK OF THE TYPE COMPRISING A FIRST ELECTRODE, AN ACTIVE LAYER, AND A SECOND ELECTRODE

(71) Applicants: COMMISSARIAT A L'ENERGIE ATOMIQUE ET AUX ENERGIES ALTERNATIVES, Paris (FR); ISORG, Grenoble (FR)

(72) Inventors: Jean-Marie Verilhac, Grenoble (FR); Simon Charlot, Grenoble (FR)

(73) Assignees: COMMISSARIAT A L'ENERGIE ATOMIQUE ET AUX ENERGIES ALTERNATIVES, Paris (FR); ISORG, Grenoble (FR)

( * ) Notice: Subject to any disclaimer, the term of this patent is extended or adjusted under 35 U.S.C. 154(b) by 0 days.

(21) Appl. No.: 14/404,695

(22) PCT Filed: Jun. 3, 2013

(86) PCT No.: PCT/IB2013/054563
§ 371 (c)(1),
(2) Date: Dec. 1, 2014

(87) PCT Pub. No.: WO2013/182970
PCT Pub. Date: Dec. 12, 2013

(65) Prior Publication Data
US 2015/0144899 A1 May 28, 2015

(30) Foreign Application Priority Data
Jun. 5, 2012 (FR) ...................................... 12 55222

(51) Int. Cl.
*H01L 51/44* (2006.01)
*H01L 51/00* (2006.01)
(Continued)

(52) U.S. Cl.
CPC ...... *H01L 51/0002* (2013.01); *H01L 51/0023* (2013.01); *H01L 51/102* (2013.01);
(Continued)

(58) Field of Classification Search
CPC ..... H01L 51/00; H01L 51/0002; H01L 51/44; H01L 51/441; H01L 51/0023; H01L 51/102; H01L 51/442; H01L 51/444
See application file for complete search history.

(56) References Cited

U.S. PATENT DOCUMENTS

| 5,350,459 A | 9/1994 | Suzuki et al. |
| 2002/0167272 A1 | 11/2002 | Inoue et al. |

(Continued)

FOREIGN PATENT DOCUMENTS

JP    11-307251    11/1999

*Primary Examiner* — Fazli Erdem
(74) *Attorney, Agent, or Firm* — Clark & Brody

(57) ABSTRACT

A method of making a stack of the type comprising a first electrode, an active layer, and a second electrode, for use in an electronic device, in particular of the organic photodetector type or the organic solar cell type, the method comprising the following steps:
- a) depositing a first layer (2) of conductive material on a substrate (1) in order to form the first electrode;
- b) depositing an active layer (3) in the form of a thin organic semiconductor layer, this layer including non-continuous zones (30);
- c) locally eliminating the first conductive layer (2) through the non-continuous zones (30) of the active layer by chemical attack; and
- d) depositing a second layer (4) of conductive material on the active layer (3) in order to form the second conductive electrode.

10 Claims, 2 Drawing Sheets

(51) Int. Cl.
*H01L 51/10* (2006.01)
*H01L 51/05* (2006.01)
*H01L 51/42* (2006.01)

(52) U.S. Cl.
CPC .......... *H01L 51/441* (2013.01); *H01L 51/442* (2013.01); *H01L 51/444* (2013.01); *H01L 51/0018* (2013.01); *H01L 51/0026* (2013.01); *H01L 51/0583* (2013.01); *H01L 51/424* (2013.01); *H01L 2251/5392* (2013.01); *H01L 2251/568* (2013.01); *Y02E 10/549* (2013.01)

(56) References Cited

U.S. PATENT DOCUMENTS

| | | | |
|---|---|---|---|
| 2004/0099305 A1 | 5/2004 | Heller | |
| 2006/0186400 A1 | 8/2006 | Okada et al. | |
| 2009/0020849 A1* | 1/2009 | Smith | H01L 22/12 257/532 |
| 2010/0062550 A1* | 3/2010 | Buchel | H01L 51/441 438/17 |
| 2010/0096004 A1* | 4/2010 | Hu | B82Y 20/00 136/256 |
| 2011/0312120 A1* | 12/2011 | Weiner | H01L 31/03923 438/64 |

* cited by examiner

METHOD OF MAKING A STACK OF THE TYPE COMPRISING A FIRST ELECTRODE, AN ACTIVE LAYER, AND A SECOND ELECTRODE

The invention relates to stacks of the type comprising a conductor, a thin organic layer, and a conductor, as used conventionally in electronic devices.

By way of example, such devices may be current rectifier diodes, solar cells, photodetector cells, capacitors, laser diodes, sensor type devices, memories, or indeed light-emitting diode (LEDs). They may in particular be organic electronic devices on a flexible plastics substrate.

The invention applies more particularly to the field of diode stacks used in organic solar cells or organic photodetectors.

In the devices known in the prior art, it can be observed that leakage currents appear through the organic thin layer that is supposed to insulate the two conductive electrodes electrically from each other, which layer is also referred to as the "active" layer.

These leakage currents depend firstly on the intrinsic properties of the active layer, in particular on its conductivity, on the presence of charge traps, on the positions of the HOMO-LUMO (highest occupied molecular orbital-lowest occupied molecular orbital) energy levels relative to work functions of the electrodes, or to its morphology, and secondly to extrinsic parameters such as stray leakage currents.

Such stray currents are not under control. They come essentially from topological defects, i.e. holes or morphological defects, i.e. zones of larger empty volume. They are generated during formation of the active layer.

Thus, the presence of holes in the active layer can lead to the two conductive electrodes being short circuited locally. Furthermore, zones of different morphologies are more likely to suffer electric breakdowns.

These defects in the active layer may be due to the materials used for forming the layer, which materials are in the form of a solution that may include some sludge, i.e. portions of material that are poorly dissolved in the solution. They may also result from defects present in the substrate, such as spikes or topological surface defects or zones presenting different surface tensions.

Such stray leakage currents are very penalizing when they occur in organic photodetectors or current rectifier diodes.

Under such circumstances, the reverse current of the diode in the dark must be very low (of the order of nanoamps per square centimeters ($nA/cm^2$)). Thus, the slightest leak of electricity via defects in the active layer can increase the reverse current by several decades and can decrease the performance of the diode in drastic and irreversible manner.

Such stray leakage currents are also penalizing for organic solar cells, but to a smaller extent.

In such a device, the lower the leakage current of the diode, the better the solar cell is capable of responding to weak illumination.

Thus, proposals have already been made for solutions that minimize stray leakage currents in the active layer of a stack.

In particular, proposals have been made: to increase the thickness of the active layer; to filter solutions before they are deposited in order to form the active layer; and to use substrates presenting few defects.

Nevertheless, the solutions that have been proposed present drawbacks.

By way of example, too great an increase in the thickness of the active layer tends to degrade the performance of the devices. That is why the thickness of the active layer generally lies in the range 200 nanometers (nm) to 300 nm. Furthermore, filtering requires a solution that presents good solubility, which is not true for all of the materials presently available for active layers. In addition, the filtering step is difficult to perform on an industrial scale. Finally, substrates that present few defects are substrates with planarizing layers, which are expensive.

An object of the invention is to minimize stray electric leakage currents through the active layer of a stack of the type comprising a conductor, an active layer, and a conductor, while maintaining corresponding device performance.

Thus, the invention provides a method of making a stack of the type comprising a first electrode, an active layer, and a second electrode, for use in an electronic device, in particular of the organic photodetector type or the organic solar cell type, the method comprising the following steps:

a) depositing a first layer of conductive material on a substrate in order to form the first electrode;

b) depositing an active layer in the form of a thin organic semiconductor layer, this layer including non-continuous zones;

c) locally eliminating the first conductive layer through the non-continuous zones of the active layer by chemical attack; and d) depositing a second layer of conductive material on the active layer in order to form the second conductive electrode.

Because of the local elimination of the conductive layer at the locations of defects in the active layer, the two electrodes can no longer come into contact, and as a result cannot create an electrical short circuit through the active layer. Leakage currents are therefore considerably reduced.

The first layer of conductive material may be made of at least one material selected from a transparent conductive oxide, a metal, and a carbon-containing material.

The metal may be in the form of a continuous layer or in the form of an array of metal nanowires.

In preferred manner, step c) is performed by means of an etching solution or by means of a solvent.

This etching solution, like the solvent, may be applied to the entire active layer or in localized manner.

Furthermore, the active layer may be deposited on the first layer of conductive material in the form of a continuous layer or in localized manner.

In preferred manner, an interface layer may be deposited between the first layer of conductive material and the active layer, i.e. between steps a) and b). Likewise, an interface layer may be deposited between the active layer and the second conductive layer, i.e. between steps c) and d).

It should be observed that this interface layer would not suffice on its own to provide electrical insulation between the two conductive electrodes at defects in the active layer, if the method of the invention were not also performed.

Furthermore, a layer of dielectric material may advantageously be deposited locally between the first layer of conductive material and the active layer, or on the active layer.

Finally, the invention provides a stack of the type comprising a first electrode, an active layer, and a second electrode, for use in an electronic device and comprising in succession:

a first layer of conductive material forming the first electrode and including zones having no material;

an active layer in the form of a thin organic semiconductor layer, this layer including non-continuous zones; and a second layer of conductive material, forming the second conductive electrode.

The invention can be better understood and other objects, advantages, and characteristics thereof appear more clearly on reading the following description, which is made with reference to the accompanying drawings, in which.

Elements that appear in more than one of the figures are given the same references in each of them.

Figure 1:
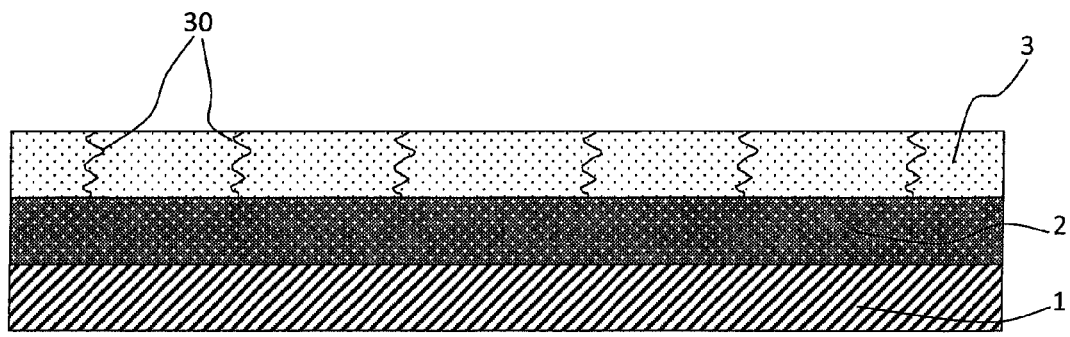
FIGS. 1 to 3 show steps in performing the method of the invention, all of these figures being section views.

FIG. 1 shows a substrate 1 that may be of any kind. By way of example, it may be a rigid substrate made of glass or a flexible substrate made of plastics material, e.g. a material of the polyethylene terephthalate (PET) or of the polyethylene naphthalate (PEN) type.

A layer of conductive material 2 is deposited on the substrate 1. This layer 2 is to form the first conductive layer.

The first electrode is preferably semitransparent at wavelengths in the ultraviolet (UV), visible, and near infrared (IR) range.

The thickness of the layer 2 lies in the range 1 nm to several micrometers (μm).

The material constituting the layer 2 may be one of four types that are described below.

Firstly it may be a transparent conductive oxide (type 1).

The oxide may be deposited in the form of a single layer, e.g. of indium tin oxide (ITO), of Al-doped ZnO (AZO), of gallium-doped ZnO (GZO), of indium-doped ZnO (IZO), or of indium- and gallium-doped ZnO (IGZO).

The oxide may also be deposited in the form of two or three layers of different materials, e.g. ITO/Ag/ITO, AZO/Ag/AZO, AZO/Au/AZO, AZO/Ag/ZnO, or indeed ZnO/Ag/ZnO.

The material of the layer 2 may equally well be a metal (type 2), e.g. Ag, Au, Pd, Pt, Cu, Cr, Ti, Al, TiW, or Ni.

The metal layer may be a solid layer or it may be a layer based on nanoparticles (Ag, Au, . . . ). Either way, the layer is continuous.

The metal layer presents small thickness, in particular thickness of less than 10 nm if the first electrode is to be transparent. Otherwise, its thickness could be greater.

The conductive layer may also be made in the form of a mat or an array of percolating metal nanowires (type 3). Thus, electrical continuity exists between the nanowires of the array. Under such circumstances, the layer is not continuous. It may be provided over the entire surface of the substrate or it may be spatially localized.

The nanowires may in particular be made of silver or of gold.

Finally, the layer 2 may be made with carbon containing materials (type 4).

In particular, it may comprise conductive polymers of poly(3,4-ethylenedioxythiophene) polystyrene sulfonate (PEDOT/PSS) type, of polyaniline (PANI), arrays of percolating conductive carbon nanotubes, or indeed of graphene.

For all types of conductor, the layer 2 may be a layer that is continuous or that is spatially localized. Either way, it may either be non-structured (a layer that is continuous or in the form of a mat of nanowires), or else it may be structured, e.g. in the form of a grid.

In practice, the layer 2 may be constituted exclusively by a material belonging to one of the four above-mentioned types. It could equally well be in the form of a mixture based on a plurality of materials, or indeed a stack of layers of those various materials, singly or in a mixture. An example of a mixture might be a type 4 layer made of PEDOT/PSS doped with carbon nanotubes or indeed a type 4 material mixed with a material of types 1, 2, or 3.

The layer 2 may be deposited using conventional vacuum techniques, e.g. sputtering or evaporation. It may also be deposited using a liquid technique, e.g. a printing technique of the silkscreen type, in atomic form or in the form of a dispersion of particles. The particles may be of nanometer size or of microscopic size, or indeed they may be of nanofilament type. Finally, the layer 2 may also be deposited in sol-gel form.

Optionally, an interface layer may be deposited on the layer 2. This layer is not shown in FIG. 1;

This interface layer may for example be made of: PEDOT/PSS, graphene, polyfluorene derivative, tetrakis(dimethylamino)ethylene (TDAE), poly(ethylene oxide), ethoxylated polyethylenimine (PEIE), branched polyethylenimine (PEI), $WO_3$, $MoO_3$, LiF, NiO, $V_2O_5$, $TiO_x$, ZnO, or $CsCO_3$, or indeed by using a self-assembled monolayer (SAM) on the surface of the conductive electrode.

The interface layer serves to adjust the work function of the first conductive electrode 2 relative to the active layer 3. For example, if ITO has work function of 4.6 electron volts (eV), the use of a fine layer of ZnO on its surface serves to adjust the surface work function (at the electrode and active layer interface) to 4.3 eV without excessively modifying the conductivity of the conductive electrode perpendicularly to the substrate.

An active layer 3 is deposited on the layer 2, or optionally on the interface layer deposited on the layer 2.

By way of example, the thickness of the layer 3 may lie in the range 1 nm to several micrometers.

With organic photodetectors and organic solar cells, the active layer is constituted by at least one material of semiconductive nature.

The active layer is advantageously constituted by a mixture of an electron donor material and an electron acceptor material. The donor semiconductor material may be a molecule, an oligomer, or a conjugated π organic polymer, with alternating single bonds and double bonds. The mixture that is conventionally used is the couple constituted by regioregular poly(3-hexylthiophene) (RR P3HT) and [6,6]-phenyl C61 butyric acid methyl ester ([60]PCBM). Other large gap donor polymers (PFB, TFB, PTAA, PCDTBT, etc. . . . ) or small gap donor polymers (PDPP3T, PCPDTBT, Si-PCPDTBT, PDDTT, etc. . . . ) could advantageously be used. Likewise, for the acceptor material, other materials may advantageously be used of the type comprising derivatives of C60, C70, or C80 (PCBM, indene-C60, indene-C60 bis adduct), carbon nanotubes, molecules of acene diimide type, or of polymer type (F8BT, N2200). When reference is made to Examples 4 and 5 mentioned below, the acceptor material may also be of inorganic kind, such as nanoparticles of $TiO_2$ or of ZnO.

Thus, the active layer may be a heterojunction of an electron donor material and an electron acceptor material in the form of a layer or a stack of a plurality of layers. It may also be a mixture at nanometer scale of two materials in the form of a volume heterojunction, i.e. an intimate mixture of two materials at nanometer scale.

The materials constituting the active layer are deposited in the form of solutions. These solutions may be filtered so as to limit the presence of sludge. This also serves to limit the creation of defects in the active layer.

As mentioned above, the active layer 3 has non-continuous zones, i.e. defects, that are referenced 30 in FIG. 1.

These defects may consist in micrometer-sized holes or in zones presenting large empty volumes. They may comprise pores or indeed volumes that are not occupied by polymer chains. They may have dimensions lying in the range 1 nm to several millimeters.

Figure 2:
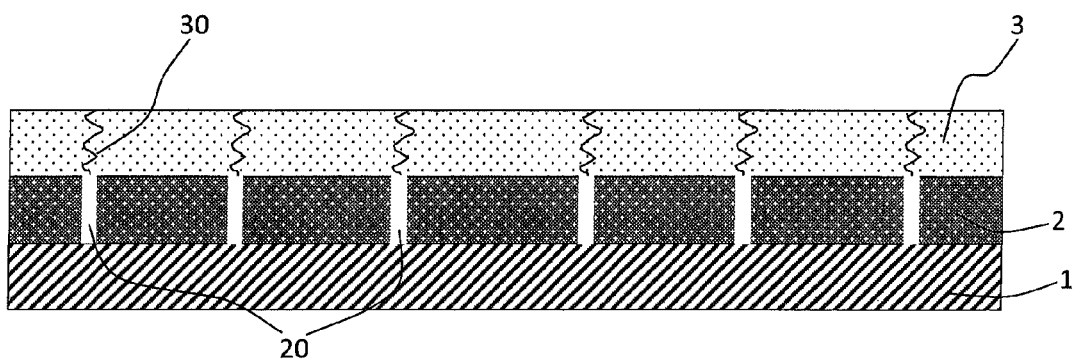

FIG. 2 shows another step of the method during which the conductive layer is eliminated locally through the defects 30.

This local elimination is obtained by an etching technique, preferably a wet technique, i.e. by being put into contact with an etching solution. In some circumstances, this elimination may be obtained using a solvent. It is nevertheless the term "etching solution" that is generally used in the description below.

Naturally, the etching solution should be selected so as to avoid degrading the electrical, optical, and mechanical properties of the active layer. The electrical properties of the active layer may be degraded as a result of its conductivity being increased or decreased, or indeed as a result of generating charge traps that may be intrinsic or extrinsic to the active layer. By way of example degradation of the optical properties of the active layer may give rise to a decrease in its properties of absorbing light at the desired wavelength. Finally, degradation of the mechanical properties may give rise in particular to the active layer becoming unstuck, cracking, or losing flexibility.

Thus, in general manner, the etching solution that is used should be selective, i.e. it should be capable of etching the conductive layer 2 without also etching or attacking the active layer 3.

In general, the etching solution comprises an acid, a base, or a neutral solution. It may be pure or it may be diluted in water or in a solvent orthogonal to the active layer, i.e. a solvent that is not capable of attacking or dissolving the active layer. An orthogonal solvent may be of one of the following types: methanol, ethanol, ethylene glycol, diethylene glycol, propylene glycol monomethyl ether acetate (PGMEA), 3-methoxypropionitrile, 2-ethoxyethanol, 1.2 dichloroethane, 1-butanol, n-butylacetate, or indeed isopropanol.

In preferred manner, the etching solution is diluted in water, and preferably in water that has been deionized in order to avoid potential contamination by ions, in particular metallic ions (Na+, etc. . . . ).

The person skilled in the art knows how to select the nature and the concentration of the strong acid (of the $HNO_3$, HCl, $H_2SO_4$, KI, oxalic acid, or indeed $H_3PO_4$ type), or of the weak acid (of the oxalic acid, $CH_3CO_2H$, or $NH_4^+$ type), or indeed of the strong base (of the NaOH or KOH type), or of the weak base (of the $NH_3$ or $CH_3CO_2^-$ type), as a function of the nature of the conductive electrode and the etching speed. In this respect, reference may be made in particular to the work "Thin film processes" by John L. Vossen and Werner Kern, published by Academic Press, New York, 1978.

In general, the etching speed lies in the range 1 angstrom per second (Å/s) to 1000 Å/s.

The etching solution is applied to the active layer 3 and it penetrates through the non-continuous zones 30 in the active layer. The etching solution may be applied to the entire surface of the active layer or in localized manner. It may make use of localized deposition when a plurality of different devices share a common die, with some of the devices being sensitive to the etching solution.

The etching solution then reaches the conductive layer 2 through the zones 30, thus making it possible to eliminate the layer 2 locally in the zones that are referenced 20 in FIG. 2.

These zones 20 thus have no material.

In order to enhance etching of the zone 2, it is preferable for the etching solution to penetrate rapidly through the zones 30.

The penetration speed of the etching solution may be increased by using a hot reaction medium, i.e. a medium at a temperature lying in the range 25° C. to 200° C. Its temperature preferably lies in the range 30° C. to 60° C.

Likewise, in order to assist wetting, it is possible to use wetting elements of surface-active type. These elements should then be added to the etching solution.

The penetration speed of the etching solution may also be increased by treatments for increasing the surface tension of the active layer 3. These may in particular be plasma type oxygenation treatments ($O_2$, $SF_6$, $N_2$, mixtures), UV-$O_3$, UV-free, atmospheric plasmas, or indeed treatments based on a liquid technique (of the type involving dipping in solvents or in solutions based on polar molecules).

The duration of the etching depends on temperature and on pressure, on the materials constituting the stack, and also on the etching solution.

The organic semiconductors of the active layer may be doped by the presence of ions that are positive or negative. This doping is reversible. The ions may be of a kind identical to those present in the etching solutions used for the invention. Nevertheless, in the method, no sign of unintended doping of the active layer has been observed.

In general, the duration of etching is selected so that the area of the zone 20 etched in the layer 2 through a defect 30 in the active layer 3 is not less than the area of the defect. The surfaces involved lie in the planes of the layers 2 and 3.

Figure 4:
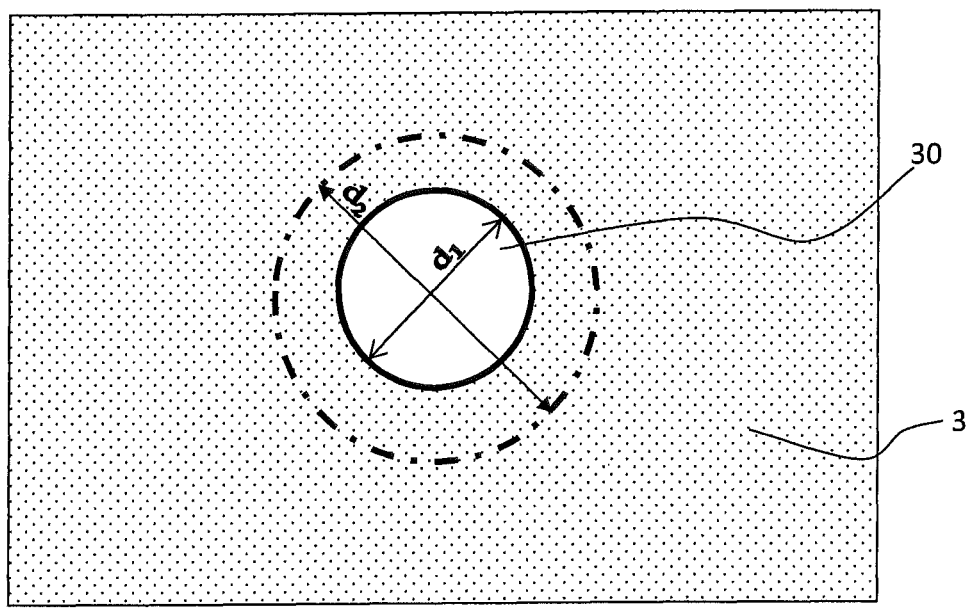
FIG. 4 is a plan view showing a detail of FIG. 2.

This is shown in FIG. 4 which is a plan view showing the layer 3 at a defect 30. The defect is a micrometer-sized hole of inlet represented diagrammatically by a disk. This disk has a diameter $d_1$.

In dashed outline, FIG. 4 also shows the zone 20 of the layer 2 that has been etched and that is thus free from any material, and in particular from any conductive material. This zone 20 is shown diagrammatically in the form of a disk of diameter $d_2$ which is greater than $d_1$.

Thus, for a hole, $d_2$ is not less than $d_1$, and it is preferably not less than $1.5 \times d_1$.

Naturally, the non-continuous zone 30 may present a shape other than that of a disk. In particular, it may be in the form of an elongate crack.

Under all circumstances, the zone 20 presents at least the dimensions of the defect and preferably one dimension that is at least 1.5 times as great.

It should also be observed that when the layer 2 is in the form of a stack of a plurality of layers of different materials, different etching solutions may also be used in succession in order to be able to etch away completely the entire layer 2.

This also applies if an interface layer has been deposited between the layers 2 and 3.

In a variant, the active layer 3 is not deposited continuously on the layer 2, but is deposited in the form of localized patterns. This makes it possible to obtain improved performance and to reduce the consumption of active materials. Such localized deposition may be obtained by a printing technique or indeed by a subtractive lithographic method.

The layer 2 is always attacked through the defects in the layer 3.

In another variant embodiment, a layer of dielectric material is deposited locally between the layer 2 and the active layer 3 or on the active layer 3. This dielectric layer serves to protect the zones of the layer 2 that it is desired not to expose to the etching solution.

This layer of dielectric material is in the form of a localized layer obtained by a printing technique, or by photolithography.

When this layer is present between the layers 2 and 3, it may be constituted by a photolithographic resin, such as 51818 or SU8 resist resin, for example.

It may also be made of polyethylene, polypropylene, cycloolefin, or indeed a curable polymer.

When it is deposited on the active layer, it must be capable of being deposited in a solvent that is orthogonal to the active layer, and it must not dissolve in the etching solution that is to be applied to the active layer.

It may be constituted in particular by a material of the fluorinated polymer type, in particular polytetrafluoroethylene (PTFE), Cytop, Half on, Teflon or ortho360 resin from the supplier Orthogonalinc.

The following materials may be used between the layers 2 and 3 and on the layer 3: polyvinylphenol, polyvinylpyrrolidone, polyvinylalcohol, or fluorinated polymer.

This layer serves to define zones where the layer 2 is attacked by the etching solution. It should be observed that when the etching solution is applied locally, undesirable contamination may exist in certain zones. This contamination does not exist if these zones are protected by a dielectric material.

Once etching has terminated, the stack shown in FIG. 2 is rinsed, so as to stop the etching reaction and so as to eliminate any residual traces of the etching solution in the active layer 3.

This rinsing step should be performed by dipping at least in a bath of deionized water, of an orthogonal solvent, or indeed of a mixture of water and orthogonal solvent. In a variant, the rinsing solution may be slightly acid (if the previous chemical attack was basic, and vice versa) in order to buffer the pH of the solution during rinsing.

Naturally, the stack may also be rinsed by spraying an appropriate liquid, as a variant to being dipped in a bath.

When the material(s) constituting the layer 2 is/are of type 1, 2, or 3, the elimination of such material(s) from the zones 20 is performed by chemical reaction mechanisms causing the conductive material to be transformed and degraded in order to dissolve it/them.

When the material constituting the layer 2 is of type 4, the zones 20 are formed by mechanisms for selectively dissolving the conductive layer 2 relative to the active layer 3, given that the materials constituting the layers 2 and 3 are both of carbon-containing type. Under such circumstances, it is not an etching solution proper that is used but rather a solvent. The solvent dissolves the layer 2 without dissolving the layer 3.

Figure 3:
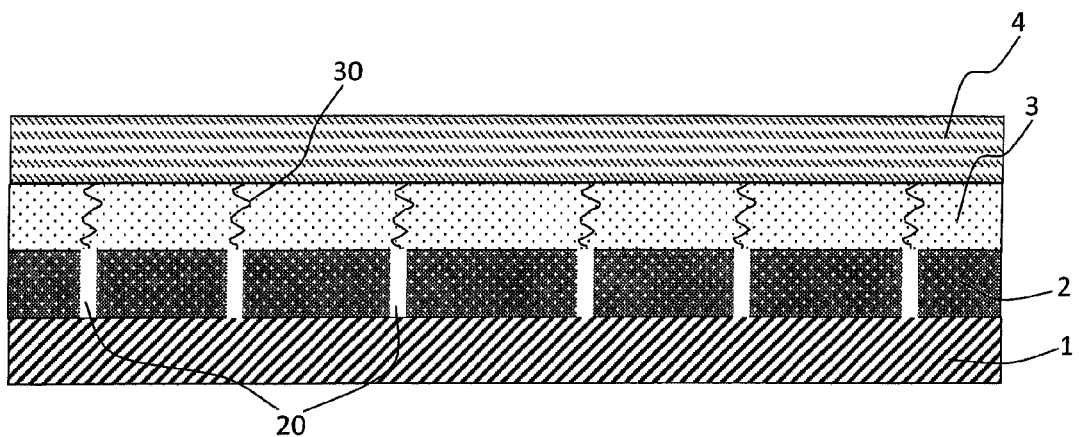

FIG. 3 shows a last step of the method of the invention in which a layer 4 of conductive material is deposited to form the second conductive electrode.

This layer 4 may be formed by a material of any of the four types described above for the layer 2.

The layer 4 may be in the form of a monolayer of one of these materials, of a mixture based on a plurality of these materials, or indeed of a stack of layers of these various materials, singly or mixed together.

It may be deposited using the same techniques as those used for depositing the layer 2.

Because of the local elimination of the material constituting the layer 2 from the zones 20, it is not possible for the electrodes 2 and 4 to come into contact, in spite of the existence of defects 30.

This makes it possible to reduce the appearance of leakage currents in the active layer 3 to a considerable extent by eliminating electrical short circuits.

This thus makes it possible to mitigate the drawbacks of stacks known in the prior art, while also avoiding increasing the thickness of the active layer and using filter techniques which are difficult to perform on an industrial scale.

In a variant, if the filtering step is maintained, it may be facilitated by using filters having larger pores, e.g. 1 µm or 5 µm instead of 0.2 µm or 0.45 µm. Such filters may allow more sludge to pass through, which might give rise to defects that cause stray currents. Nevertheless, since the invention it makes it possible to limit leakage currents, the operation of the device that is obtained remains improved.

When the layer 4 is deposited using a liquid technique, i.e. in the form of a material in a solvent, it is appropriate to ensure that the material constituting the layer 4 does not come into contact with the materials constituting the layer 2 by passing through the defects 30.

This can be obtained by imparting high viscosity to the material that is deposited on the layer 3. Under such circumstances, the layer 4 solidifies as a result of the solvent evaporating before the deposited material has time to diffuse through the defects in the active layer.

If the material used has low viscosity, it is then appropriate during the etching step to make zones 20 that are of dimensions that are large enough for the material constituting the layer 4 to solidify before reaching the material constituting the layer 2.

Several implementations of the method of the invention are described below.

In all of the examples, the method is performed so as to make organic photodiodes on a rigid substrate made of glass or a flexible substrate made of plastics material, e.g. of the PET or PEN type.

Furthermore, in all of the examples, the active layer is of the volume heterojunction type. It is deposited on the entire surface area of the layer 2 by spin-coating, or by other printing techniques of the slot die, doctor-blade, silkscreen, photogravure, ink jet, or spray type.

This active layer 3 is a mixture of electron donor material and electron acceptor material. The donor material may be a conjugated polymer of one of the following types: poly (3-hexylthiophene) or regioregular or random P3HT, PCDTBT, PCPDTBT, or Si-PCPDTBT.

Furthermore, the acceptor material may be a molecular of fullerene type (C60, C70, C80) or a fullerene derivative (60PCBM, 70PCBM, 80PCBM), or a small molecule of the acene diimide family or a conjugated polymer of F8BT or N2200 type sold by the supplier Polyera.

The thickness of the active layer lies in the range 5 nm to $2 \times 10^4$ nm.

The active layer is preferably annealed after being deposited. Annealing serves to freeze the morphology of the active layer and to eliminate any solvents trapped in the active layer. It also serves to improve bonding of the active layer 3 on the layer 2 prior to the step of dipping in the etching solution.

In Examples 1 to 4, the second electrode may be a layer 4 of Ag ink. This material may be deposited in an aqueous solution by an ink jet, silkscreen, photogravure, slot die, or spray technique.

Furthermore, an interface layer of PEDOT-PSS may be used between the layers 3 and 4. This interface layer may be of the $MoO_3$, $NO_3$, $V_2O_5$, Nafion, polyfluorene, or poly (ethylene oxide) type.

In these first four examples, the metal conductive layer 5 may be deposited by evaporating a metal of the Ag, Au, or Pt type.

In Example 5, the second electrode 4 is constituted by a metal layer, such as that which is provided in Examples 1 to 4.

The interface layer between the layers 3 and 4 is made of ZnO.

The data specific to each of the Examples 1 to 5 is summarized in the table below.

In particular, the table specifies the etching solutions or solvents used, and also the durations of the etching, depending on the nature of the material(s) constituting the layer 2 (first electrode).

Other diodes (●) were made in accordance with the method of the invention, a chemical etching step being performed after depositing the active layer and before depositing the second electrode.

This step was performed in accordance with variant 1 of Example 1, using the etching solution having the trade name TE100, for a duration of 30 seconds (s).

The stack of the three layers (first electrode, interface layer, and active layer) was rinsed with deionized water, and then dried for 2 minutes (min) at 100° C.

Figure 5:
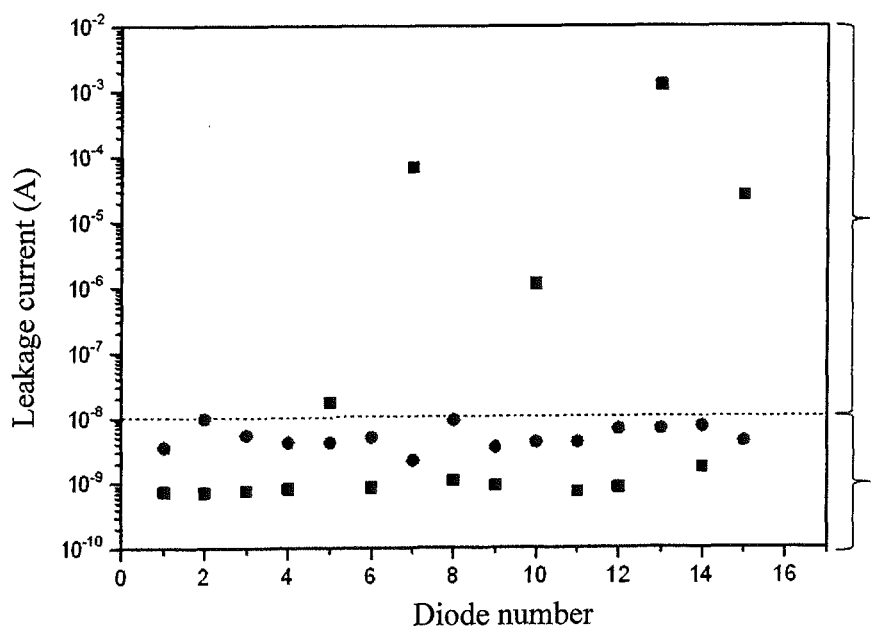
FIG. 5 is a graph plotting the measured leakage current for diodes of the prior art (■) and for diodes obtained using a method of the invention (●).

FIG. 5 shows that a fraction of the standard diodes (■) corresponds to certain diodes having a random leakage current that may be greater than $10^{-8}$ Å. Other standard diodes present a leakage current that is low.

In contrast, all of the diodes of the invention (●) correspond to a leakage current of less than $10^{-8}$ Å.

|  | Example 1 | Example 2 | Example 3 | Example 4 | Example 5 |
| --- | --- | --- | --- | --- | --- |
| First electrode (layer 2) | Transparent conductive oxide AZO monolayer | Transparent conductive oxide AZO/Ag/AZO or ZnO/Ag/ZnO multilayer | Au metal | Mat of Ag nanowires | PEDOT/PSS conductive polymer |
| Thickness of the layer 2 | 50 nm to 500 nm | 67 nm/9 nm/42 nm | <10 nm if layer transparent | <1 μm | 50 nm to 500 nm |
| Interface layer (between layers 2 and 3) |  |  | $TiO_x$, ZnO |  | — |
| Thickness of interface layer |  |  | A few tens of nm |  | — |
| Etching solution or solvent | Variant 1: based on HCl (1%-5% vol) of $FeCl_3$ (25%-30%) diluted in water Variant 2: based on oxalic acid 0.001 mol/L in DI water Variant 3: based on dilute HCl (0.01% vol) in DI water |  | Based on KI (75 g/L) and $I_2$ (6.34 g/L) diluted in water | Based on $HNO_3$ (20% vol) diluted in water | Deionized water |
| Temperature of the etching solution | Variant 1: 40° C.- 50° C. Variants 2 and 3: ambient temperature |  | Ambient temperature | Ambient temperature | About 50° C. |
| Duration of etching | Variant 1: 30 s Variants 2 and 3: 10 nm/min |  |  | 15 s | 5 min |
| Rinsing after etching |  |  | Deionized water |  | — |
| Drying after rinsing |  |  | 100° C./2 min |  |  |
| Interface layer (between layers 3 and 4) |  |  | PEDOT-PSS |  | ZnO |
| Second electrode (layer 4) |  |  | Metal |  |  |

Reference is now made to FIG. 5 which gives the value of the leakage currents for a plurality of diodes. The identification numbers of the diodes are plotted along the abscissa axis and their dark currents measured with a bias of −1 volts (V), corresponding to the diodes being reverse-biased, are plotted up the ordinate axis.

The diodes were obtained using a stack of the Example 1 type, comprising:
- a first electrode 2 made of AZO with thickness of 125 nm;
- an interface layer made of ZnO, with thickness of 40 nm;
- an active layer 3 made of a mixture of P3HT and of PCBM, presenting a thickness of 300 nm; and
- a second electrode 4 made of PEDOT/PSS, with thickness of 200 nm, covered in a layer of Ag with thickness of 8 μm.

Certain diodes (■), referred to as "standard diodes" were not subjected to any particular treatment.

It can thus be seen that the method of the invention makes it possible to reduce stray leakage currents in diodes and thus to eliminate the risk of leakage currents appearing, as exists with standard diodes.

It should also be observed that in Examples 3 and 4, the presence of an interface layer made of ZnO requires a second etching step to be provided. It uses the same etching solution as variant 1 of Examples 1 and 2 (with the trade mark TE100), which solution is sold by the supplier Transene, and is used at a temperature lying in the range 40° C. to 50° C. for a duration of 10 s.

In contrast, in Examples 1 and 2, the same etching solution is used to perform step c) of the method and for etching the interface layer.

In a variant of Examples 1 and 2, the etching solution may be replaced by a silkscreenable paste of the Isishape HiperEtch 9S type (sold by the supplier Merck) or of the ITO126-1 type (sold by the supplier Transene).

The paste is deposited locally by silkscreen printing so as to avoid damaging certain devices. It is then heated to a temperature of about 100° C. in order to etch the conductive layer 2.

The duration of the etching step is a function of the thickness of the layer 2.

Reference signs included after the technical characteristics appearing in the claims have the sole purpose of facilitating understanding of the claims and they do not limit their scope.

The invention claimed is:

1. A method of making a stack of a type comprising a first electrode, an active layer, and a second electrode, for use in an electronic device, in particular of the organic photodetector type or the organic solar cell type, the method comprising the following steps:
   a) depositing a first layer (2) of conductive material on a substrate (1) in order to form the first electrode;
   b) depositing an active layer (3) in the form of a thin organic semiconductor layer, this layer including non-continuous zones (30);
   c) locally eliminating the first conductive layer (2) through the non-continuous zones (30) of the active layer (3) by chemical attack;
   d) depositing a second layer (4) of conductive material directly on the active layer (3) in order to form the second conductive electrode; and
   wherein step c) is performed by means of an etching solution diluted in a solvent that is not capable of attacking or dissolving the active layer.

2. A method according to claim 1, wherein the first layer (2) is made of at least one material selected from a transparent conductive oxide, a metal, and a carbon-containing material.

3. A method according to claim 2, wherein the at least one material is in the form of a continuous layer or of an array of metal nanowires.

4. A method according to claim 1, wherein the etching solution is applied to the entire active layer (3).

5. A method according to claim 1, wherein the etching solution is applied to the active layer (3) locally.

6. A method according to claim 1, wherein the active layer is deposited in the form of a continuous layer or in localized manner.

7. A method according to claim 1, wherein an interface layer is deposited between the first layer (2) of conductive material and the active layer (3), and/or between the active layer (3) and the second layer (4) of conductive material.

8. A method according to claim 1, wherein a layer of dielectric material is deposited between the first layer of conductive material (2) and the active layer (3), or on the active layer.

9. A method according to claim 1, wherein said solvent is selected from the group consisting of methanol, ethylene glycol, diethylene glycol, propylene glycol monoethyl ether acetate (PGMEA), 3-methoxypropionitrile, 2-ethoxyethanol, 1,2 dichloroethane, 1-butanol, and n-butylacetate isopropanal.

10. A stack of a type comprising a first electrode, an active layer, and a second electrode, for use in an electronic device and comprising in succession:
    a first layer (2) of conductive material forming the first electrode and including zones (20) having no material;
    an active layer (3) in the form of a thin organic semiconductor layer, this layer including non-continuous zones (30); and
    a second layer (4) of conductive material deposited directly on the active layer (3), forming the second conductive electrode, and
    wherein said zones (20) having no material are aligned with said non-continuous zones (30) in the direction of said stack.

* * * * *